Figure 1:
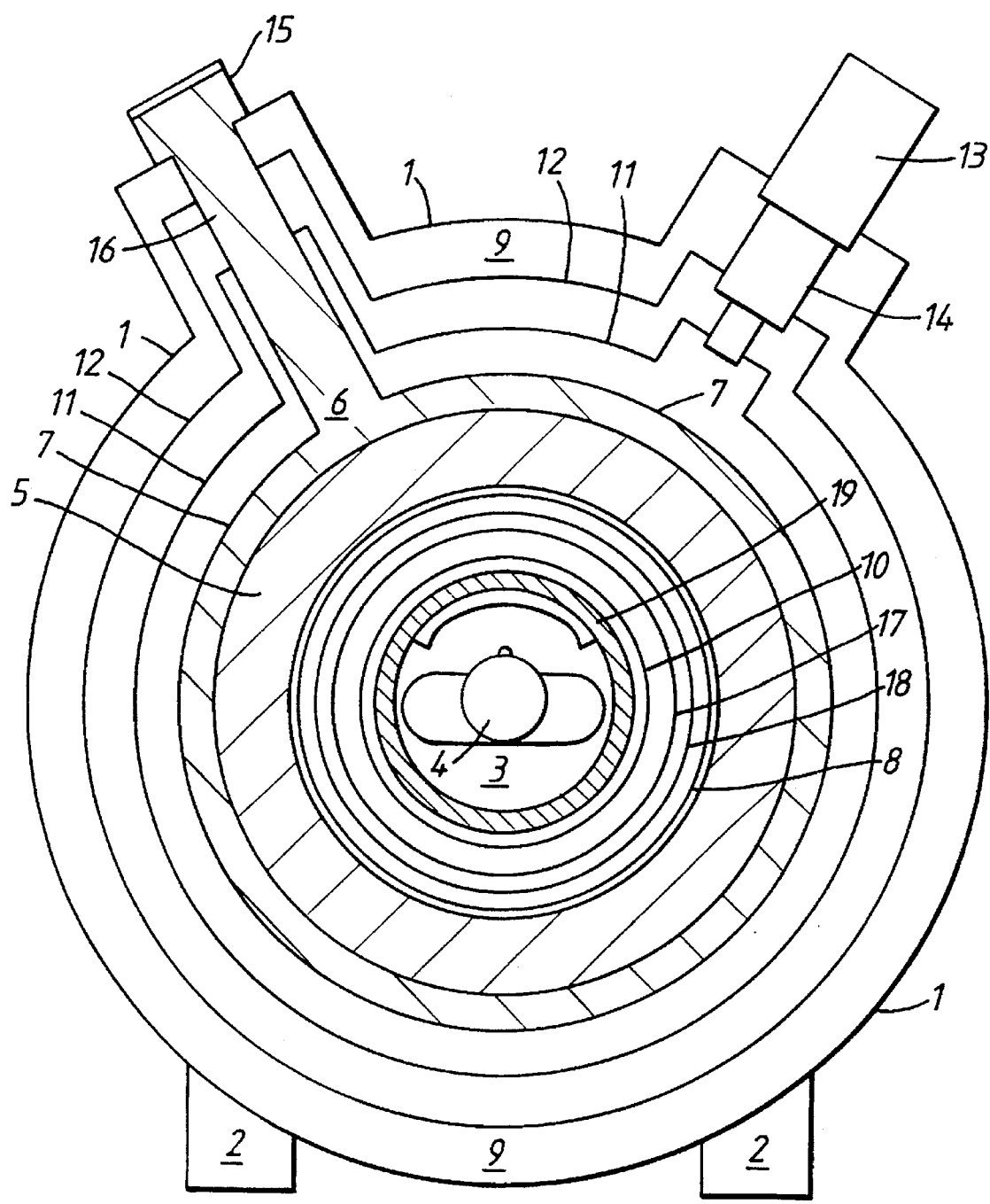

United States Patent

Gore

[11] Patent Number: 5,642,624
[45] Date of Patent: Jul. 1, 1997

[54] SUPER-CONDUCTING MAGNETS

[75] Inventor: Russell Peter Gore, Abingdon, England

[73] Assignee: Oxford Magnet Technology Limited, Oxford, England

[21] Appl. No.: 595,084

[22] Filed: Feb. 1, 1996

[30] Foreign Application Priority Data

Feb. 10, 1995 [GB] United Kingdom ............ 9502766

[51] Int. Cl.⁶ .................................... F25B 19/00
[52] U.S. Cl. .................................. 62/51.1; 62/295
[58] Field of Search ........................ 62/51.1, 285, 295

[56] References Cited

U.S. PATENT DOCUMENTS

| | | | |
|---|---|---|---|
| 4,777,807 | 10/1988 | White | 62/51.1 |
| 4,782,671 | 11/1988 | Breneman et al. | |
| 4,930,318 | 6/1990 | Brzozowski | 62/51.1 |
| 4,959,964 | 10/1990 | Saho et al. | 62/51.1 |
| 5,129,232 | 7/1992 | Minas et al. | |
| 5,222,366 | 6/1993 | Herd et al. | 62/51.1 |
| 5,235,818 | 8/1993 | Horikawa et al. | 62/51.1 |
| 5,260,266 | 11/1993 | Herd et al. | 62/51.1 X |
| 5,265,430 | 11/1993 | Chen et al. | 62/51.1 X |
| 5,307,037 | 4/1994 | Woods et al. | |
| 5,363,077 | 11/1994 | Herd et al. | 62/51.1 X |
| 5,379,600 | 1/1995 | Moritsu et al. | 62/51.1 X |
| 5,396,206 | 3/1995 | Herd et al. | 62/51.1 X |
| 5,410,286 | 4/1995 | Herd et al. | 62/51.1 X |

FOREIGN PATENT DOCUMENTS 2272061 5/1994 United Kingdom.

*Primary Examiner*—Christopher Kilner
*Attorney, Agent, or Firm*—Keck, Mahin & Cate

[57] ABSTRACT

A super-conducting electro-magnet for use in an MRI system comprising a helium vessel within which magnet windings are positioned, a vacuum chamber within which the helium vessel is contained, at least one thermal shield positioned between the helium vessel and the vacuum chamber, a service turret having a neck tube which is arranged to extend through the thermal shield within the vacuum chamber so as to communicate with the helium vessel for filling purposes, the thermal shield being thermally coupled to the service turret neck tube by means of a plurality of flexible connector strips fabricated from laminated conductive material which at one end are secured to the thermal shield and which at the other end thereof are secured to the service turret neck tube, sufficient strips being provided substantially to surround the service turret neck tube thereby to provide a substantially continuous thermally conductive junction between the service turret neck tube and the thermal shield.

11 Claims, 2 Drawing Sheets

SUPER-CONDUCTING MAGNETS

This invention relates to super-conducting electro-magnets for use in magnetic resonance imaging (MRI) apparatus.

Super-conducting electro-magnets for MRI apparatus comprise windings immersed in liquid helium so that they are cooled to temperatures of about 4° K at which they become super conductors. A helium vessel containing the windings is positioned within a vacuum chamber which serves to reduce heat gain by convection. In order to reduce heat gain by radiation, thermal shields are positioned between the helium vessel and the vacuum chamber which are usually cooled. In order to cool the thermal shields, a refrigerator is provided in a refrigerator turret which extends into the vacuum chamber to provide access to the thermal shields which are thermally coupled to the refrigerator. In order to provide access to the windings for current injection purposes, and access to the helium vessel for filling and topping up purposes, a service turret is provided also having neck tube for access.

It will be appreciated that it is important that the thermal shields positioned between the vacuum chamber and the helium vessel, should be efficient thermal shields in regions adjacent to the service turret neck tube. It is also important that in these regions, some degree of flexibility is provided so that vibrations produced external to the cryostat (e.g. when gradient coils operatively associated with the MRI system are pulsed or floor transmitted vibrations) will be tolerated, and so that assembly of the magnet is facilitated.

In known systems, a flanged tubular copper collar is provided for each thermal shield, through which the service turret neck tube is arranged to project, the flange of a collar being bolted to a thermal shield and the end of a collar remote from the flange being thermally coupled to the neck tube by means of several braided copper thermal connectors which are equi-angularly spaced around the collar, the connectors being bolted at one end to the collar and at the other end thereof to the neck tube.

Although generally satisfactory in operation, this known arrangement has the disadvantages that it tends to be expensive to fabricate and time consuming to assemble.

It is therefore an object of the present invention to provide an improved arrangement in the region between a thermal shield and a turret neck tube which will serve at least partly to overcome these disadvantages.

According to the present invention, a super-conducting electro-magnet for use in an MRI system comprises a helium vessel within which magnet windings are positioned, a vacuum chamber within which the helium vessel is contained, at least one thermal shield positioned between the helium vessel and the vacuum chamber, a service turret having a neck tube which is arranged to extend through the thermal shield within the vacuum chamber so as to communicate with the helium vessel for filling purposes, the thermal shield being thermally coupled to the service turret neck tube by means of a plurality of flexible connector strips fabricated from laminated conductive material which at one end are secured to the thermal shield and which at the other end thereof are secured to the service turret neck tube, sufficient strips being provided substantially to surround the service turret neck tube thereby to provide a substantially continuous thermally conductive junction between the service turret neck tube and the thermal shield.

By utilising flexible connector strips fabricated from laminated conductive material, the need for flanged collars is obviated with a consequential cost saving, whilst providing a particularly efficient thermal junction region between the service turret neck tube and the heat shield which is comparatively simple to fabricate and to assemble.

Inner and outer thermal shields may be provided which are positioned between the helium vessel and the vacuum chamber in spaced apart relationship, each thermal shield being thermally coupled to the service turret neck tube by means of flexible thermally conductive laminated connector strips, the strips connected to each shield being arranged substantially to surround the service turret neck tube, the strips coupled to the inner thermal shield being positioned within and spaced apart from the strips coupled to the outer thermal shield.

The thermal shield or shields may be thermally coupled to a refrigerator.

The refrigerator may be contained in a refrigerator turret having a neck tube through which the heat shields are coupled to the refrigerator.

The strips may be substantially permanently secured to the thermal shield(s) as by means of rivets, screws or by brazing or soldering, whereas the strips may be secured removably to the neck tube as by means of screws or bolts to facilitate assembly.

The strips may each be made of several contiguous layers of flat copper material.

The layers may be tinned.

There may be at least four layers laminated in each strip. The strips connected to the inner thermal shield may comprise four layers and the strips connected to the outer thermal shield may comprise eight layers.

There may be eight strips connected to each thermal shield arranged to define an octagonal segmented enclosure.

Each strip may be shaped to taper from an end secured to the thermal shield to an end secured to the neck tube, whereby the octagonal segmented enclosure is tapered.

Figure 2:
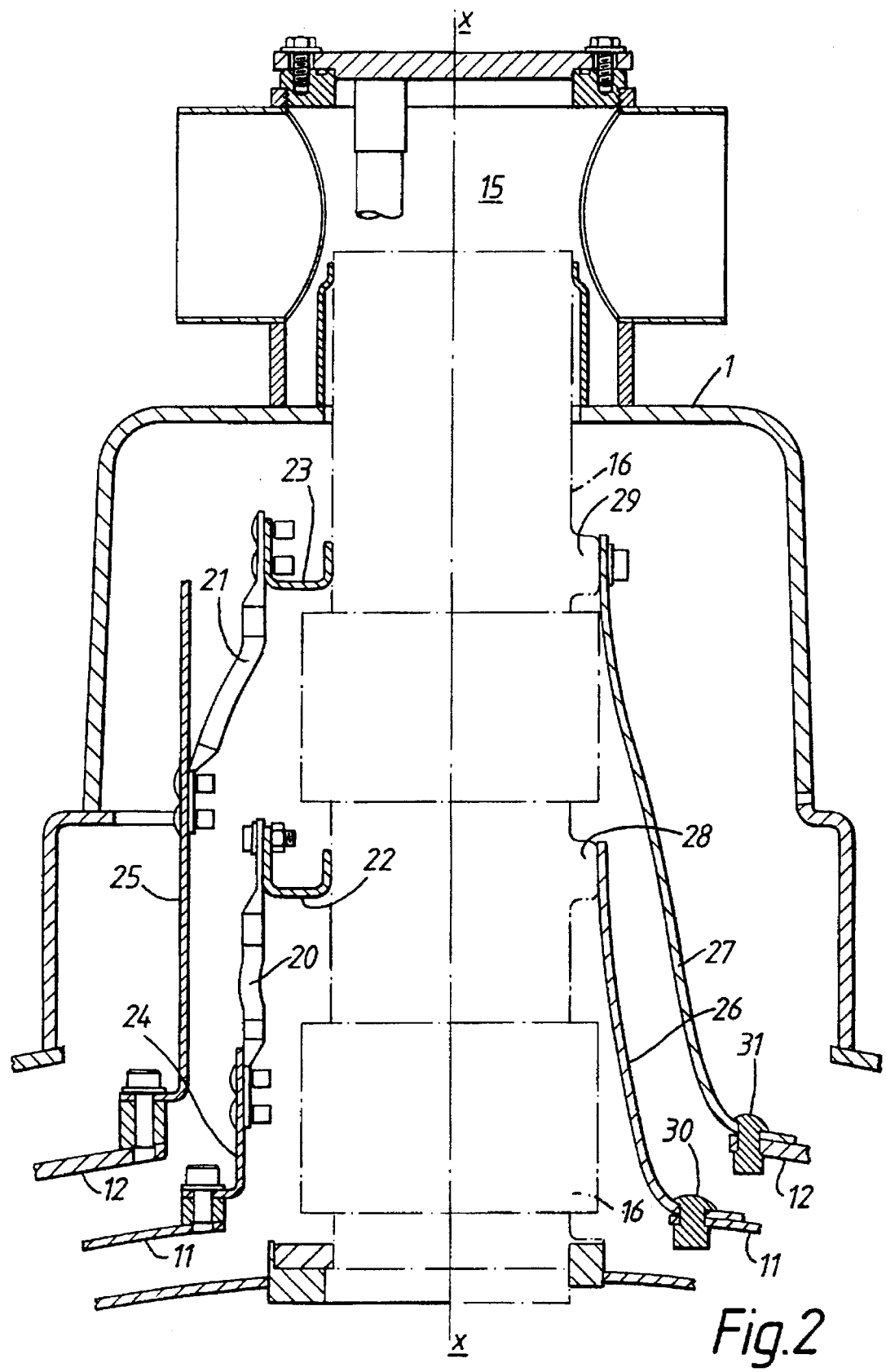

One embodiment of the invention will now be described by way of example only with reference to the accompanying drawings, in which, FIG. 1 is a somewhat schematic sectional end view of an MRI system including a super-conducting electro-magnet, and wherein, FIG. 2 is a sectional side view of a service turret forming part of the system shown in FIG. 1, the view being divided into two halves by a centre line XX such that parts to the left of the centre line XX comprise a known construction whereas parts to the right of the centre line XX comprise material according to one embodiment of the present invention.

Referring now to FIG. 1, an MRI system comprises a housing 1 supported on feet 2 within which is provided an elongate generally cylindrical space 3 within which a patient 4 is supported. Surrounding the space 3 there is provided an electro-magnet defined by an annular winding 5, the winding 5 being contained within a helium filled vessel 6 having an outer shell 7 and an inner shell 8. In order to reduce heat gain which would cause 'boil off' of helium from the vessel 6, the vessel 6 is contained within a vacuum space 9, the outer wall of which is defined by the housing 1 and an inner wall of which is defined by a bore tube 10. In order to reduce heat gain by radiation, inner and outer thermal shields 11 and 12 respectively are provided in spaced apart relationship between the outer shell 7 and the housing 1 which defines the outer wall of the vacuum chamber.

In order to cool the heat shields so as still further to reduce heat gain, a refrigerator 13 is provided having a refrigerator mount or 'unisock' 14 which is arranged to couple the refrigerator 13 to the thermal shields 11 and 12 respectively, whereby cooling is effected.

In order to facilitate filling of the vessel 6 with helium and to provide access to the winding 5 for current injection purposes, a service turret 15 is provided having a neck portion 16 which extends through the thermal shields 11 and 12 and through the outer wall of the housing 1.

In order to fully screen the vessel 6, an outer shield bore tube 17 is provided which is spaced apart from an inner shield bore tube 18, the inner shield bore tube 18 and the outer shield bore tube 17 being extended around each end of the housing 1 to connect with the shields 12 and 11 respectively thereby to provide complete shielding. Similarly the outer wall of the housing 1 is extended around each end to join with the inner wall 10 of the housing. Similarly, the outer shell 7 of the flask is extended around each end within the housing 1 to join with the inner shell 8.

As will be appreciated by those skilled in the art, gradient and RF coils 19 are provided within the cylindrical space 3 as required for imaging.

In order to reduce heat gain by the helium as much as possible, it is important that the thermal shields 11 and 12 be coupled in a thermally efficient manner to the neck tube 16.

Referring now to FIG. 2, wherein parts corresponding to FIG. 1 bear the same numerical designations, a known coupling arrangement between the heat shields 11 and 12 and the neck tube 16 is shown, comprising flexible braided copper connectors 20 and 21 which at one end are connected to the neck tube 16 via brackets 22 and 23 respectively and which at the other ends are connected to the heat shields 11 and 12 respectively via flanged stainless steel collars 24 and 25 respectively.

In an improved arrangement shown to the right hand side of the centre line XX, the flexible braided copper connectors 20 and 21 and the flanged collars 24 and 25 are replaced by laminated copper strips 26 and 27 which are used to couple the thermal shields 11 and 12 respectively to the neck tube 16. Although only two strips 26 and 27 are shown in FIG. 2, eight strips are used to completely surround the neck tube 16. The strips thus form an octagonal segmented enclosure with the strips connected to the heat shield 11 being arranged to extend within the enclosure formed by the strips 27 which are connected to the thermal shield 12. The strips 26 and 27 are bolted to bosses 28 and 29 which are raised from the neck portion 16 and at an end remote from the bosses 28 and 29, the strips 26 and 27 respectively are connected by means of rivets 30 and 31 respectively to the thermal shields 11 and 12 respectively.

It will be appreciated that by utilising laminated copper strips, the need for expensive flanged copper collars is obviated, whilst retaining flexibility which facilitates assembly and affording the thermal capacity required to ensure effective thermal shielding.

I claim:

1. A super-conducting electro-magnet for use in an MRI system comprising a helium vessel within which magnet windings are positioned, a vacuum chamber within which the helium vessel is contained, at least one thermal shield positioned between the helium vessel and the vacuum chamber, a service turret having a neck tube which is arranged to extend through the thermal shield within the vacuum chamber so as to communicate with the helium vessel for filling purposes, the thermal shield being thermally coupled to the service turret neck tube by means of a plurality of flexible connector strips fabricated from laminated conductive material which at one end are secured to the thermal shield and which at the other end thereof are secured to the service turret neck tube, sufficient strips being provided substantially to surround the service turret neck tube thereby to provide a substantially continuous thermally conductive junction between the service turret neck tube and the thermal shield.

2. A super-conducting electro-magnet as claimed in claim 1, wherein, inner and outer thermal shields are provided which are positioned between the helium vessel and the vacuum chamber in spaced apart relationship, each thermal shield being thermally coupled to the service turret neck tube by means of flexible thermally conductive laminated connector strips, the strips connected to each shield being arranged substantially to surround the service turret neck tube, the strips coupled to the inner thermal shield being positioned within and spaced apart from the strips coupled to the outer thermal shield.

3. A super-conducting electro-magnet as claimed in claim 1, wherein the thermal shield or shields are thermally coupled to a refrigerator.

4. A super-conducting electro-magnet as claimed in claim 3, wherein the refrigerator is contained in a refrigerator turret having a mount through which the heat shields are coupled to the refrigerator.

5. A super-conducting electro-magnet as claimed in claim 1, wherein the connector strips are substantially permanently secured to the thermal shield(s), whereas the strips are secured removably to the neck tube.

6. A super-conducting electro-magnet as claimed in claim 1, wherein the strips are each made of several contiguous layers of flat copper material.

7. A super-conducting electro-magnet as claimed in claim 6, wherein the layers are tinned.

8. A super-conducting electro-magnet as claimed in claim 6, comprising at least four layers.

9. A super-conducting electro-magnet as claimed in claim 8, wherein strips connected to an inner thermal shield comprise four layers and wherein strips connected to an outer thermal shield comprise eight layers.

10. A super-conducting electro-magnet as claimed in claim 1, comprising eight strips connected to each thermal shield(s) arranged to define an octagonal segmented enclosure.

11. A super-conducting electro-magnet as claimed in claim 10, wherein each strip is shaped to taper from an end secured to a thermal shield to an end secured to the neck tube, whereby the octagonal segmented enclosure is tapered.

\* \* \* \* \*